Aug. 16, 1938. LE ROY J. LEISHMAN Re. 20,827

MEANS AND METHOD FOR TURNING ROTATABLE OBJECTS TO PREDETERMINED POSITIONS

Original Filed Dec. 15, 1934

INVENTOR:

Le Roy J. Leishman

Reissued Aug. 16, 1938

Re. 20,827

UNITED STATES PATENT OFFICE 20,827

MEANS AND METHOD FOR TURNING ROTATABLE OBJECTS TO PREDETERMINED POSITIONS

Le Roy J. Leishman, Los Angeles, Calif.

Original No. 2,108,538, dated February 15, 1938, Serial No. 149,245, June 19, 1937, which is a division of Serial No. 757,644, December 15, 1934. Application for reissue May 23, 1938, Serial No. 209,594

12 Claims. (Cl. 74—480)

The invention herein described is a division of my Patent No. 2,084,851, issuing June 22, 1937, and filed December 15, 1934, and relates to improvements in automatic apparatus for turning rotatable objects about their axes to predetermined positions and more particularly to means whereby a plurality of such objects may be immediately and simultaneously rotated to any one of several pre-selected positions or "settings" which may be different for each rotated object.

The purposes of this invention are to provide simple apparatus for turning dials, shafts and the like to the particular settings required in using an instrument or machine for a definite task; to afford means whereby a plurality of such rotatable elements may be simultaneously turned each to a pre-selected position which may be different from that to which any other such element is being turned; to provide a simple manually operated control for accurately returning such rotatable elements to any desired previous position; to provide mechanism whereby a single manual operation will cause a plurality of rotatable members each to be turned to any one of a group of pre-selected positions; to provide means for simultaneously setting the dials of a radio receiving set and a television receiving set; to make it possible for a single manual operation to tune either a radio set or a television set, or both; and to afford means whereby the apparatus may easily be adjusted so that a definite manual operation will cause the desired rotatable element to be turned to a desired position.

The application of this invention to radio and television makes it possible to "tune in" a radio broadcasting station and its associated television broadcasting station in far less time and with much less bother than would otherwise be required. The large number of pictorial elements needed in television for the transmission of a single detailed image within the time period of the persistence of vision, makes the use of short waves desirable; and further, the governments of various countries have allotted certain frequencies in the short wave bands for this purpose. For these and other reasons, the satisfactory transmission of both sound and vision by radio waves requires that they be transmitted on different carrier frequencies. To receive both the sound and the associated television, the radio receiving set must be tuned to the frequency on which the radio broadcasting station is transmitting, and the short wave television receiver must be tuned to the different frequency of the television broadcasting station which transmits the images of the scene at which the radio program originates. The dial settings for these stations are entirely different, and it is therefore impractical to turn the dials synchronously by any connecting means, such as gears, belts or a common shaft. The present invention makes it possible to accomplish this double tuning by a single manual operation.

Still other objects of this invention will be evident as the description proceeds.

Figure 1:
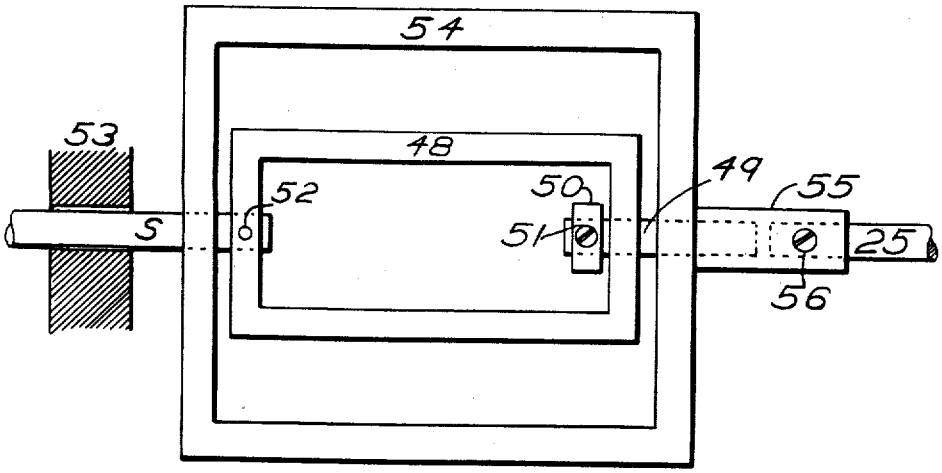
Fig. 1 shows a pair of concentric rectangular rockers, each attached to a different control shaft.

The rocker 48, Fig. 1, is pivoted at one end on an immovable shaft 49 held in support 50 by screw 51. The other end is attached to shaft S by pin 52. Shaft S has a journal 53 and may be considered as connected to a radio tuning device. Rocker 54 is free to pivot on shafts S and 49, but has a hub 55 attached by screw 56 to shaft 25 of a television tuner, not shown.

An optional modification is to omit the shaft 49 and extend control shaft 25 through the bearing of rocker 48 into journal 50. If control shaft 25 is adequately supported, the journal also may be omitted. In either case, rocker 48 must not be attached to shaft 25.

Figure 2:
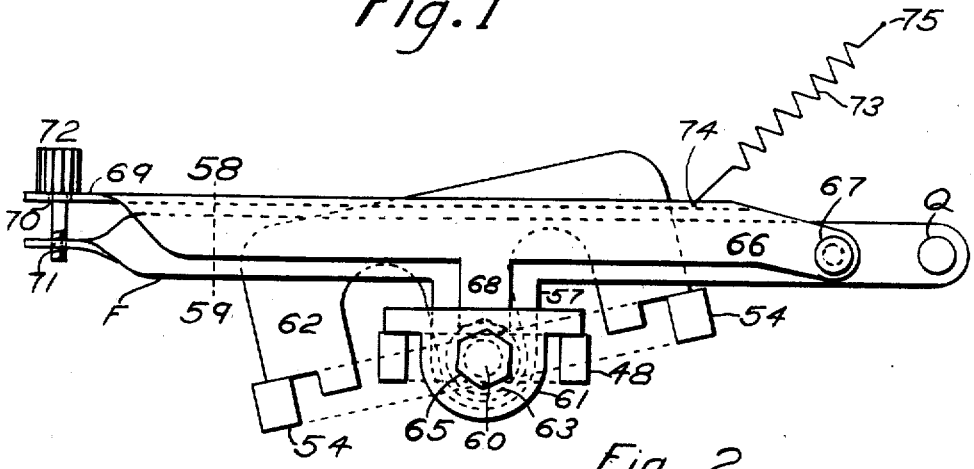
Fig. 2 shows a side view of the rockers of Fig. 1, together with a positioning lever assembly having adjustable tappets for engaging the rockers.
Figure 3:
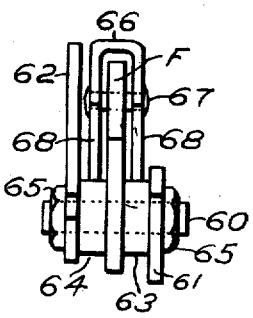
Fig. 3 is a section of the lever assembly shown in Fig. 2, taken on line 58—59.

In Fig. 2, the lever F, pivoted on rod Q, has an extension 57, also shown in Fig. 3, which is a cross section taken on line 58—59, Fig. 2. The extension 57 carries a pin 60, on which are pivoted tappets 61 and 62 having hubs 63 and 64 respectively, shown most clearly in Fig. 3. The tappets are kept from coming off the pivot by nuts 65. Lever 66 straddles lever F as shown in Fig. 3, and is pivoted on rivet 67 as indicated in both Figs. 2 and 3. Lever 66 has legs 68 for engaging the hubs of the tappets. The free end of lever 66 has a flat horizontal section 69 having a hole 70. The end of lever F is shaped similar to the end of lever 66, and has a smaller hole than that in lever 66. This hole is tapped to admit the set screw 71 which passes through hole 70 in the upper lever. The set screw has a knurled top 72. When this set screw is tightened, the legs 68 of lever 66 clamp down on hubs 63 and 64, thus keeping the tappets from turning. This lever assembly is raised up from the position shown to an inoperative position by spring 73 attached to the lever at 74 and to a stationary support at 75.

To set an automatic tuner of this kind so that it will return the tuning shafts S and 25 to any angular position that may be required to bring in a pair of associated radio and television stations, the lever assembly is pressed down, set screw 71 loosened to take the tension from hubs 63 and 64, permitting the tappets to move freely, and with the lever still held down, the desired associated stations are tuned in by the regular manual tuners (not shown here) and the set-screw tightened again to fix the tappets in the positions to which they were moved by the rockers during the manual tuning operation. How the tappets or rockers move to the angular position of whichever is the fixed member, will be evident from Fig. 2. After the automatic tuner has been set in this manner, the lever may be released, permitting the spring 73 to raise the assembly out of the way of the rockers which are now free to move to other angular positions as other stations are tuned in.

By placing the finger on the knurled knob 72 and pressing the lever down, the tappets will strike the rockers in whatever angular position they may happen to be, and will move them to the position occupied when the setting operation took place.

When the lever assembly is all the way down, it will be observed from Fig. 2 that the pin 60 is substantially co-axial with the rockers 48 and 54, which means that in this position it is also co-axial with shafts S, 49 and 25, shown in Fig. 1. Pin 60 and shafts S, 49 and 25 are therefore all approximately equidistant from the fulcrum Q.

If a plurality of such lever assemblies are mounted on shaft Q, each one may be set to bring in a different pair of radio and television stations.

In using this automatic tuning apparatus, it is not necessary that radio and television tuners be attached directly to the shafts indicated. The sets may be some distance apart and the motion of the automatic tuning mechanism transmitted by cords, belts, shafts and universal joints, chains, gears or even flexible shafts.

Still other modifications may be made from the automatic tuning systems and devices herein described without departing from the general nature and purpose of the invention.

My claims are:

1. A combination including a plurality of rotatable members having a common axis, a lever manually movable in a plane transverse to said axis, a plurality of adjustable members pivoted to said lever at a point substantially as far from the fulcrum of said lever as said axis is from said fulcrum, each of said adjustable members adapted to engage one of said rotatable members upon movement of said lever, and to move said rotatable member to a predetermined angular position, and means for fixing said adjustable members upon their pivots in predetermined angular positions at will.

2. A combination including a plurality of rotatable members having a common axis, a first lever manually movable in a plane transverse to said axis, a plurality of adjustable members pivoted to said lever at a point substantially as far from the fulcrum of said lever as said axis is from said fulcrum, each of said adjustable members adapted to engage one of said rotatable members upon movement of said first lever and to move said rotatable member to a predetermined angular position, a second lever pivoted upon said first lever, said second lever adapted to engage said adjustable members and hold them in fixed positions with relation to said first lever, and means for tightening said second lever against said adjustable members.

3. A combination including a rectangular rocker having two parallel sides pivoted on an axis substantially parallel to the other sides, a second rocker of like description lying within said first rocker and independently pivoted on the same axis as said first rocker, a first tappet pivotally mounted upon a lever and adapted to engage one of said rockers, a second tappet mounted upon said lever and adapted to engage the other rocker, said tappets adapted to rotate said rockers to predetermined angular positions upon movement of said lever.

4. A combination including a rectangular rocker having two parallel sides pivoted on an axis substantially parallel to the other two sides, a second rocker of like description lying within said first rocker and independently pivoted upon the same axis as said first rocker, a first tappet movably mounted upon a first lever and adapted to engage one of said rockers, a second tappet movably mounted upon said first lever and adapted to engage the other rocker, said tappets adapted to rotate said rockers to predetermined angular positions upon movement of said lever, and a second lever pivotally mounted upon said first lever and adapted to engage said tappets and hold them in fixed positions with relation to said first lever.

5. The combination with the tuning mechanism of a radio apparatus; of a rotatable rocker mounted upon a shaft operatively connected with said mechanism, said rocker having two arms each extending on a different side of said shaft; means movable about a pivot and acting upon operation in one direction to slidably engage either arm of said rocker and push it in one direction to an angular position at which the movement of said rocker is arrested by the collision of said means and the oppositely moving other arm of said rocker; and a spring for holding said means in a normally inoperative position.

6. In a radio communication device, a combination including: two independently rotatable control shafts; a first pair of positionable elements operatively connected with one of said shafts; a second pair of positionable elements operatively connected with the other of said shafts; an operating lever; a first and second tappet member adjustably mounted on said lever; said first tappet member adapted upon movement of said lever to engage said first pair of positionable elements; and said second tappet member adapted upon movement of said lever to engage said second pair of positionable elements.

7. In combination with the tuning mechanism of a radio apparatus, of a rotatable rocker mounted upon a shaft operatively connected with said mechanism, said rocker having two arms each extending on a different side of said shaft; means adjustably movable about a pivot and acting upon bodily movement in one direction to slidably engage either arm of said rocker and push it in one direction to an angular position at which the movement of said rocker is arrested by the collision of said means and the oppositely moving other arm of said rocker; and a spring for holding said means in a normally inoperative position; said rocker constructed so as to admit at least a portion of said means between said arms.

8. The combination with the tuning mechanism of a radio apparatus, of a rotatable rocker mounted upon a shaft operatively connected with said mechanism, said rocker having two arms each extending on a different side of said shaft; means adjustably movable about a pivot and acting upon bodily movement in one direction to slidably engage either arm of said rocker and push it in one direction to an angular position at which the movement of said rocker is arrested by the collision of said means and the oppositely moving other arm of said rocker; and a spring for holding said means in a normally inoperative position; the axis of said means being substantially co-axial with the axis of said rocker when said means is in engagement with both of said arms.

9. In a mechanism for angularly positioning a control of a radio device, a combination including: a rotatable rocker comprising two shoulders lying on opposite sides of the axis of said rocker; and a manually movable operating means comprising an adjustably mounted positioning element adapted upon movement of said means in one direction to engage one shoulder of said rocker and rotate said rocker to a position at which the movement of said element is arrested by the collision of said element and the oppositely moving other shoulder of said rocker; said rocker constructed to permit at least a portion of said means to pass beyond a line connecting the points on said shoulders at which the shoulders are contacted by said means.

10. In a mechanism for angularly positioning a control of a radio device, a combination including: a rotatable rocker comprising two shoulders lying on opposite sides of the axis of said rocker; a manually movable operating member; and a positioning element adjustably mounted on a pivot carried by said member; said element adapted upon movement of said member in one direction to engage one shoulder of said rocker and rotate said rocker to a position at which the movement of said rocker is arrested by the collision of said element and the oppositely moving other shoulder of said rocker; the axis of said element and the axis of said rocker being substantially co-axial when said element is in engagement with both of said shoulders.

11. In a mechanism for angularly positioning a control of a radio device, a combination including: a rotatable rocker comprising two arms lying on opposite sides of the axis of said rocker; a manually movable operating member; a positioning element adjustably mounted on a pivot carried by said member; said element adapted upon movement of said member in one direction to engage one arm of said rocker and rotate said rocker to a position at which the movement of said rocker is arrested by the collision of said element and the oppositely moving other arm of said rocker; said rocker having a recess between said arms so that the axis of said element and the axis of said rocker may be substantially coaxial when said element is in engagement with both of said arms; and means operable from the external end of said member for holding said element in adjusted position.

12. In a mechanism for angularly positioning a control of a radio apparatus, a combination including: a plurality of rotatable shafts; a movable operating device; and a plurality of pairs of reciprocally movable elements, each pair operatively interposed between said device and a different one of said shafts; said device comprising a movable supporting member and a plurality of positioning means adjustably mounted on said member, each of said means individual to one of said pairs of reciprocally movable elements and adapted upon movement of said member in one direction to engage one of the elements of the associated pair and rotate the associated shaft to a position predetermined by the adjustment of the associated means.

LE ROY J. LEISHMAN.

DISCLAIMER

Re. 20,827.—*Le Roy J. Leishman*, Los Angeles, Calif. MEANS AND METHOD FOR TURNING ROTATABLE OBJECTS TO PREDETERMINED POSITIONS. Patent dated August 16, 1938. Disclaimer filed January 16, 1939, by the patentee.

Hereby enters this disclaimer to clam 5 of said Letters Patent.

[*Official Gazette February 14, 1939.*]

DISCLAIMER

Re. 20,827.—*Le Roy J. Leishman*, Los Angeles, Calif. MEANS AND METHOD FOR TURNING ROTATABLE OBJECTS TO PREDETERMINED POSITIONS. Patent dated August 16, 1938. Disclaimer filed November 10, 1939, by the patentee.

Hereby disclaims from the scope of claim 8 of said Letters Patent all structure except that in which the rocker is so constructed that it may act as a common follower for a plurality of such recited movable means; and Disclaims from the scope of claim 9 of said Letters Patent all structure except that in which the positioning element is so adjustably mounted that it may be fixed and maintained in its adjusted position irrespective of repeated operations of said operating means; and Disclaims from the scope of claim 10 of said Letters Patent all structure except that in which the positioning element is so adjustably mounted that it may be fixed and maintained in its adjusted position irrespective of repeated operations of said operating member.

[*Official Gazette December 5, 1939.*]